(12) United States Patent
Matsuo et al.

(10) Patent No.: US 8,461,716 B2
(45) Date of Patent: Jun. 11, 2013

(54) PHOTOVOLTAIC POWER GENERATING DEVICE, AND CONTROLLING METHOD

(75) Inventors: Takahisa Matsuo, Izumisano (JP); Shuhei Nishikawa, Kaizuka (JP); Tsuyoshi Sekine, Izumisano (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 477 days.

(21) Appl. No.: 12/862,160

(22) Filed: Aug. 24, 2010

(65) Prior Publication Data

US 2012/0048325 A1 Mar. 1, 2012

(51) Int. Cl.
| | |
|---|---|
| H02J 1/12 | (2006.01) |
| H02J 3/00 | (2006.01) |
| H02J 5/00 | (2006.01) |
| H03K 19/00 | (2006.01) |

(52) U.S. Cl.
USPC ............................................ 307/45; 307/85

(58) Field of Classification Search
USPC .............................. 307/43, 45, 85, 86; 361/42
See application file for complete search history.

(56) References Cited

U.S. PATENT DOCUMENTS

2001/0023703 A1* 9/2001 Kondo et al. ................. 136/244

FOREIGN PATENT DOCUMENTS

| JP | 09-191579 A | 7/1997 |
| JP | 2002-091586 A | 3/2002 |
| JP | 2005-168156 A | 6/2005 |

* cited by examiner

Primary Examiner — Carlos Amaya
(74) Attorney, Agent, or Firm — Marvin A. Motsenbocker; Mots Law, PLLC

(57) ABSTRACT

A photovoltaic power generating device comprising a current collecting box side detector for detecting a ground fault in each of the photovoltaic strings, a switch disposed in correspondence to each of the photovoltaic strings and interposed between the photovoltaic string and a connecting cable, a current collecting box including a control unit providing an on/off control of the switch according to the detection result from the detector, a detector for detecting a ground fault in a connecting cable between the current collecting box and the power conditioner, a switch interposed between the connecting cable and the inverter, and a power conditioner having a control unit providing an on/off control of the switch according to the detection result from the detector.

8 Claims, 7 Drawing Sheets

PHOTOVOLTAIC POWER GENERATING DEVICE, AND CONTROLLING METHOD

BACKGROUND OF THE INVENTION

1. Field of the Invention

The present invention relates to a photovoltaic power generating device, and controlling method thereof.

2. Description of the Prior Art

A photovoltaic cell generates direct current power by converting the natural energy into electrical energy. With increasing awareness of the recent environmental issues, a photovoltaic power generating device has received attention as a clean power generating device emitting no carbon dioxide which contributes to the global warming.

A large scale photovoltaic power generating system of current interest, such as a mega solar system, aims at achieving an output of more than 1000 kW and includes thousands of photovoltaic modules having an output on the order of 200 W and interconnected to form arrays.

By the way, the above-described photovoltaic power generating system may sometimes encounter ground fault resulting from the deterioration of insulation performance of the photovoltaic modules, wirings or the like, which is induced by some factors including installation environment, use situation and the like. In the event of a ground fault, it is necessary to locate a poor insulation and implement an appropriate recovery process.

U.S. Pat. No. 6,593,520 discloses a photovoltaic power generating device arranged such that in the event of a ground fault in a part of a photovoltaic array, the operation of the whole photovoltaic power generating device is not suspended but only a photovoltaic string suffering the failure is disconnected from the photovoltaic power generating device.

This photovoltaic power generating device includes the current collecting box for collecting the outputs from a plurality of photovoltaic strings each including a plurality of photovoltaic panels connected in series. The current collecting box includes: a detector for outputting a failure detection signal upon detection of a failure in any one of the plural photovoltaic strings; an intermediate switch shifted to an open state by the failure detection signal from the detector; and string switches capable of disconnecting for every photovoltaic strings. The current collecting box is configured such that the string switch is switched off by the failure detection signal.

This photovoltaic power generating device is for domestic use and hence, the current collecting box is installed inside the house so that an inspection operation is relatively easy.

SUMMARY OF THE INVENTION

However, as the photovoltaic power generating device is increased in size, the number of current collecting boxes is also increased. Further, installation sites also become diverse. What is more, the distance between the current collecting box and the power conditioner is also increased, resulting in the increase in the length and the number of cables interconnecting these components.

In view of the foregoing problem, the invention seeks to provide a photovoltaic power generating device capable of proper detection of a ground fault which may occur in a photovoltaic power generating device of a larger scale than the device for domestic use.

According to the invention, a photovoltaic power generating device comprises: a plurality of photovoltaic strings; a current collecting box serving to collect electric power from the plural photovoltaic strings; and a power conditioner supplied with the electric power from the plural current collecting boxes, and having an inverter for converting the electric power into the alternating current power, wherein the current collecting box includes: a current collecting box side detector for detecting a ground fault in each of the photovoltaic strings; a switch provided in correspondence to each of the photovoltaic strings and interposed between the photovoltaic string and a connecting cable; and a current collecting box side control unit applying an on/off control to the switch according to a detection result supplied from the detector, and the power conditioner includes: an inverter side detector for detecting a ground fault in a connecting cable between the current collecting box and the power conditioner; an inverter side switch interposed between the connecting cable and the inverter; and a power conditioner side control unit applying an on/off control to the inverter side switch according to a detection result supplied from the inverter side detector.

According to the invention, a controlling method for a photovoltaic power generating device comprises: a plurality of photovoltaic strings; a current collecting box serving to collect electric power from the plural photovoltaic strings; and a power conditioner supplied with the electric power from the plural current collecting boxes, and having an inverter for converting the electric power into the alternating current power, wherein the current collecting box includes: a current collecting box side detector for detecting a ground fault in each of the photovoltaic strings; a switch provided in correspondence to each of the photovoltaic strings and interposed between the photovoltaic string and a connecting cable; and a current collecting box side control unit applying an on/off control to the switch according to a detection result supplied from the detector, and the power conditioner includes: an inverter side detector for detecting a ground fault in a connecting cable between the current collecting box and the power conditioner; an inverter side switch interposed between the connecting cable and the inverter; and a power conditioner side control unit applying an on/off control to the inverter side switch according to a detection result supplied from the inverter side detector, upon detection of a ground fault by the current collecting box side detector, the switch of the corresponding photovoltaic string is switched off so as to cut off an output from the corresponding photovoltaic string, and upon detection of a ground fault by the inverter side detector, the inverter side switch is switched off so as to break connection between the connecting cable and the inverter.

According to the invention, some failure such as ground fault generated between a current collecting box and a photovoltaic string, and between a current collecting box and a power conditioner can be properly detected.

Figure 1:
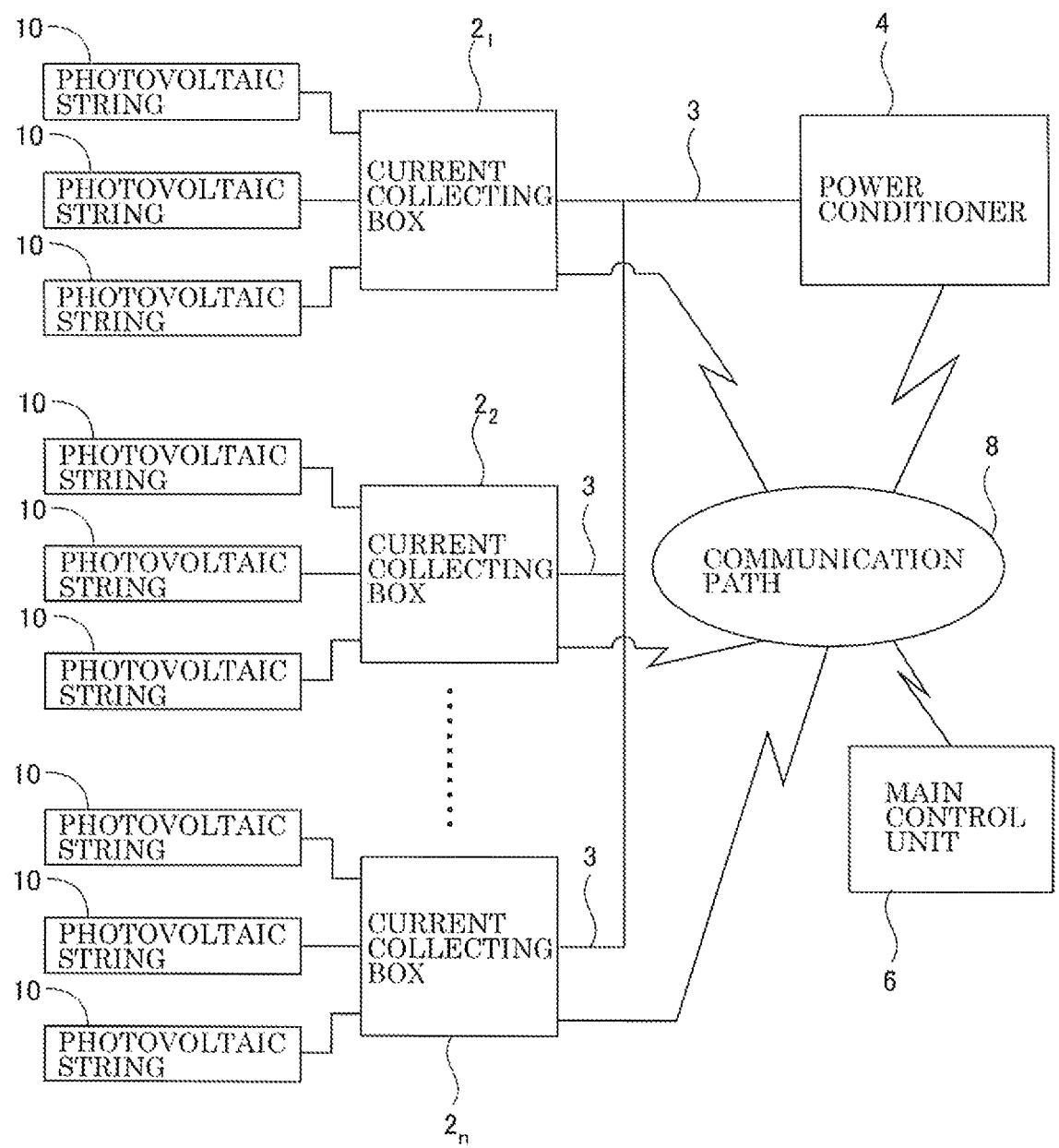
[FIG. 1] A schematic diagram showing a general arrangement of a photovoltaic power generating device according to an embodiment of the invention.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

The embodiments of the invention are described in detail with reference to the accompanying drawings. It is noted that identical or equivalent elements in the drawings will be referred to by like reference numerals and will be explained only once to avoid repetition.

Figure 2:
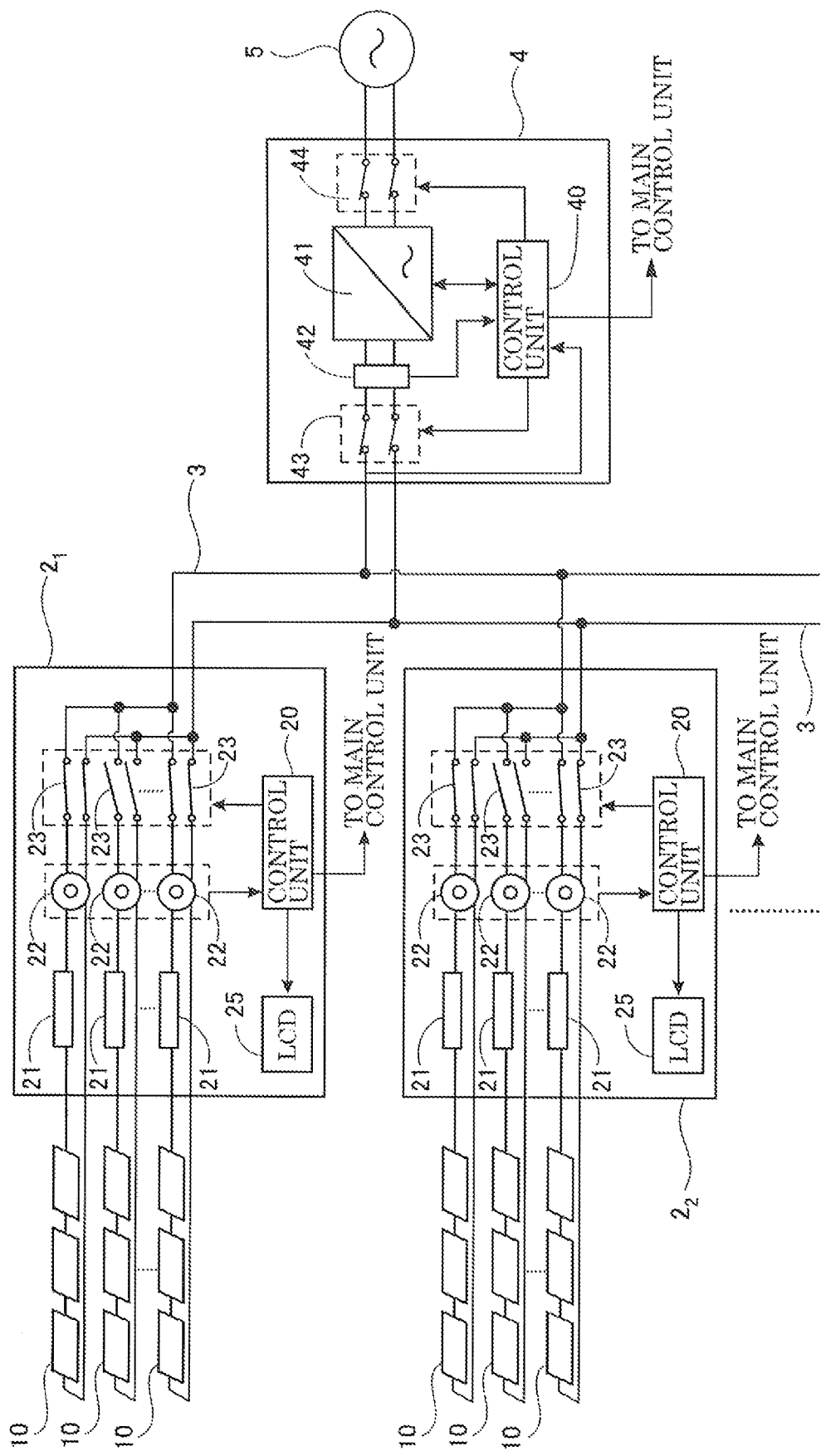
[FIG. 2] A schematic diagram showing a principal arrangement of the photovoltaic power generating device according to the embodiment of the invention.
Figure 3:
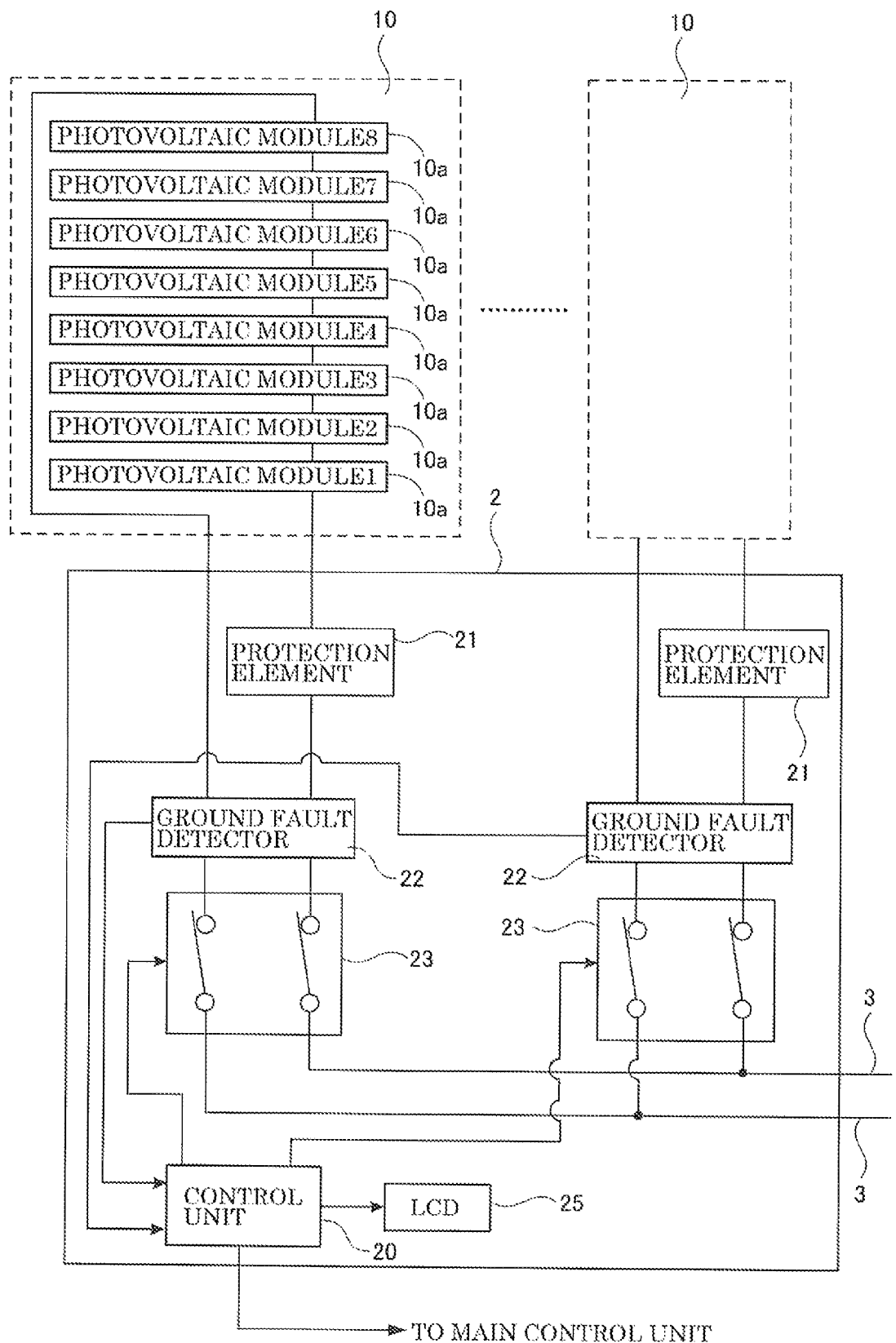
[FIG. 3] A schematic diagram showing the detail of a part including photovoltaic strings and a current collecting box according to the embodiment of the invention.

FIG. 1 is a schematic diagram showing a general arrangement of a photovoltaic power generating device according to the invention. FIG. 2 is a schematic diagram showing a principal arrangement of the photovoltaic power generating device according to the invention. FIG. 3 is a schematic diagram showing the detail of apart including photovoltaic strings and a current collecting box.

The photovoltaic power generating device according to the embodiment constitutes a medium-scale system, for example, wherein tens of photovoltaic modules having an output on the order of 200 W are interconnected, to a mega solar system wherein at least thousands of such photovoltaic modules are interconnected. The photovoltaic power generating device comprises a photovoltaic string 10 including a plurality of photovoltaic modules 10a connected in series. A current collecting box 2 is connected with a plurality of photovoltaic strings 10 so as to collect direct current outputs from the individual photovoltaic strings 10. Outputs from the plural current collecting boxes 2 ($2_1$ to $2_n$) are supplied to a power conditioner 4 via a connecting cable 3. Direct current power generated by photovoltaic cells is converted into alternating current power by an inverter 41 disposed in the power conditioner 4. Harmonic components are removed from the alternating current power by an unillustrated noise filter and the resultant alternating current power is outputted to a system 5. While FIG. 1 shows only one power conditioner 4, an alternative arrangement may be made according to the configuration or scale of the device such that more than one conditioner is employed for supplying the electric power to the system 5.

In a case where some failure such as ground fault arises in any one of the photovoltaic strings 10 connected to the current collecting box 2, a control unit 20 in the current collecting box 2 notifies a main control unit 6, disposed in a power management room or the like, of the occurrence of the failure via a communication path constituted by a network such as LAN. The communication path 8 is built properly in any one of modes that meets the need, the modes including wireless communications, cable communications and the like.

In a case where some failure such as ground fault arises at the connecting cable 3 from the current collecting box 2 to the power conditioner 4, a control unit 40 in the power conditioner 4 notifies the main control unit 6 of the failure occurrence via the communication path 8. The components shown in FIG. 1 to FIG. 3 are sequentially described as below.

As shown in FIG. 3, the photovoltaic string 10 comprises a plurality of photovoltaic modules 10a connected in series. While this figure shows the configuration of one photovoltaic string 10, the other photovoltaic strings are configured the same way. In this embodiment, the photovoltaic string 10 consists of eight photovoltaic modules 10a connected in series, each having an output on the order of 200 W. The photovoltaic string 10 supplies an output to the current collecting box 2. The number of series-connected photovoltaic modules 10a is not limited to eight but may be varied properly to permit the photovoltaic power generating device to achieve a required voltage.

The photovoltaic module 10a comprises an array of photovoltaic cells which are connected in series by means of a wiring member and are sealed between a surface member such as glass and a weather resistant backside member with a translucent sealing material such as EVA (ethylene vinylacetate) having excellent weather resistance and moisture resistance. Examples of a usable photovoltaic cell include a variety of photovoltaic cells such as crystalline photovoltaic cells, thin film photovoltaic cells and compound photovoltaic cells.

Outputs from the plural photovoltaic strings 10 of the above configuration are connected to the current collecting box 2. The number of photovoltaic strings 10 connected to one current collecting box 2 is selected properly so as to permit the photovoltaic power generating device to achieve a required output.

The plural photovoltaic strings 10 are connected in parallel to the current collecting box 2, which collects the outputs from the photovoltaic strings 10. The current collecting box 2 is installed at place accessible to a checker in proximity of the location of the plural photovoltaic strings 10 such that the cable from the photovoltaic strings 10 may be reduced in length. If any failure such as ground fault arises in the photovoltaic string 10 connected to the current collecting box 2, the failure occurrence is notified to the main control unit 6 in the power management room or the like via the communication path 8 comprising a network such as LAN. The information to be notified includes, for example, information identifying a current collecting box 2, information identifying a photovoltaic string 10 suffering a failure such as ground fault, information on a date of occurrence of a ground fault and the like. The current collecting boxes 2 and the photovoltaic strings 10 are previously assigned with ID numbers for identification, respectively, such that the information along with the ID number is sent to the main control unit 6 via the communication path 8. Such an arrangement permits the main control unit 6 to easily identify a current collecting box 2 or photovoltaic string 10 suffering the failure such as ground fault.

In the current collecting box 2, the switch 23 is provided in one-on-one correspondence to the photovoltaic string 10 so as to disconnect the corresponding photovoltaic string 10 from the circuit when the photovoltaic modules 10a and the like are given a maintenance check or when some failure such as ground fault arises in a part of the photovoltaic string 10. An on/off control of the switch 23 is provided by the control unit 20 constituted by a microcomputer or the like. The switch 23 is capable of carrying and breaking the maximum current the photovoltaic string can supply and is electrically opened and closed. When the switch 23 is in an on state or supplied with electric power from the photovoltaic string 10, an on-current is passed through the switch 23 which is maintained in a closed position. When the switch 23 is in an off state or power supply thereto is cut off, control is provided to cut off the power supply to the switch 23 which is maintained in an open position. The switch 23 comprises an electromagnetic relay which is on/off switchable by a signal from the control unit 20. As described above, the switch 23 is on when supplied with the electric power, but is off when the power supply thereto is cut off. According to the embodiment, therefore, the switch 23 is maintained in the off state during the night when the electric power is not supplied thereto. Thus, the embodiment achieves power saving during the nighttime period when the photovoltaic strings do not generate the electric power.

At the time of normal operation, the control unit 20 performs the activation process for switching on the switch 23. The activation process is started at sunrise, for example, when the photovoltaic strings 10 start receiving the sunlight. The activation process is also performed in a case where the inverter 41 is inactive during a period when the photovoltaic strings 10 can be subjected to the sunlight, namely a case where, for example, the sunlight is temporarily blocked to disable the photovoltaic strings 10 to output the electric power, or a case where an output operation of the photovoltaic strings 10 is started again. Assuming that V1 represents a startup voltage of the inverter 41, and $V_{pn}$ represents a photovoltaic voltage from the photovoltaic string 10, the control unit 20 provides the on control of the switch 23 by checking the voltage $V_{pn}$. An on-condition for the switch 23 is defined as $V_{pn}>=$(is equal to or more than) V1−50V. "50V" is merely exemplary and varies depending upon the system.

Then, at the time of normal operation, the control unit 20 performs the deactivation process for switching off the switch 23. The deactivation process except for deactivation caused by a ground fault is started at sunset, for example, when the photovoltaic strings 10 are not irradiated with the sunlight any more. The deactivation process is also performed in a case where the output from the photovoltaic strings 10 is lowered during the period when the photovoltaic strings 10 can be subjected to the sunlight. Assuming that V2 represents a shutdown voltage of the inverter 41, the control unit 20 provides the off control of the switch 23 by checking the voltage $V_{pn}$. An off-condition for the switch 23 is defined as continuation of a state $V_{pn}<=$(is equal to or less than) V2−50V for 30 minutes. The above values, 30 minutes and 50V, are merely exemplary and vary depending upon the system.

Each photovoltaic string 10 is provided with a protection element 21 such as fuse or backflow protection diode. The protection element serves to prevent current backflow resulting from different voltages generated in the individual photovoltaic strings 10 due to different installation positions of the photovoltaic strings 10 or different sunlight radiation conditions.

A ground fault detector 22 for ground fault detection is interposed between a respective pair of switch 23 and photovoltaic string 10. The ground fault detector 22 detects a differential current between a forward current cable and a backward current cable based on magnetic fields generated in these cables. If the detection result is equal to or more than the constant value, a signal indicating the occurrence of ground fault is output to the control unit 20. The detection sensitivity of the ground fault detector 22 is defined in correspondence to noise superimposed on the cable from the photovoltaic strings 10 or the like. Based on the output from the ground fault detector 22, the control unit 20 can determine which of the photovoltaic strings 10 suffers the ground fault. Instead of utilizing the magnetic field, the ground fault detector 22 may employ a clamp-on current sensor for detecting the differential current.

Detecting the occurrence of a ground fault, the control unit 20 switches off the switch 23 connected to the photovoltaic string 10 suffering the ground fault, namely provides control to break the circuit. The control unit 20 cuts off the power supply to the corresponding switch 23 so as to switch off the same. The switch 23 is controlled by the control unit 20 so as to cut off the power supply from the photovoltaic string 10 suffering the ground fault.

The control unit 20 stores, in an internal storage device thereof, information concerning the occurrence of ground fault and the photovoltaic string 10 suffering the ground fault and displays the information on a display unit 25 comprising a liquid crystal display (LCD) or the like. The control unit also sends information to the main control unit 6 via the communication path 8, the information concerning the current collecting box 2, the occurrence of ground fault and the photovoltaic string 10 suffering the ground fault.

Figure 4:
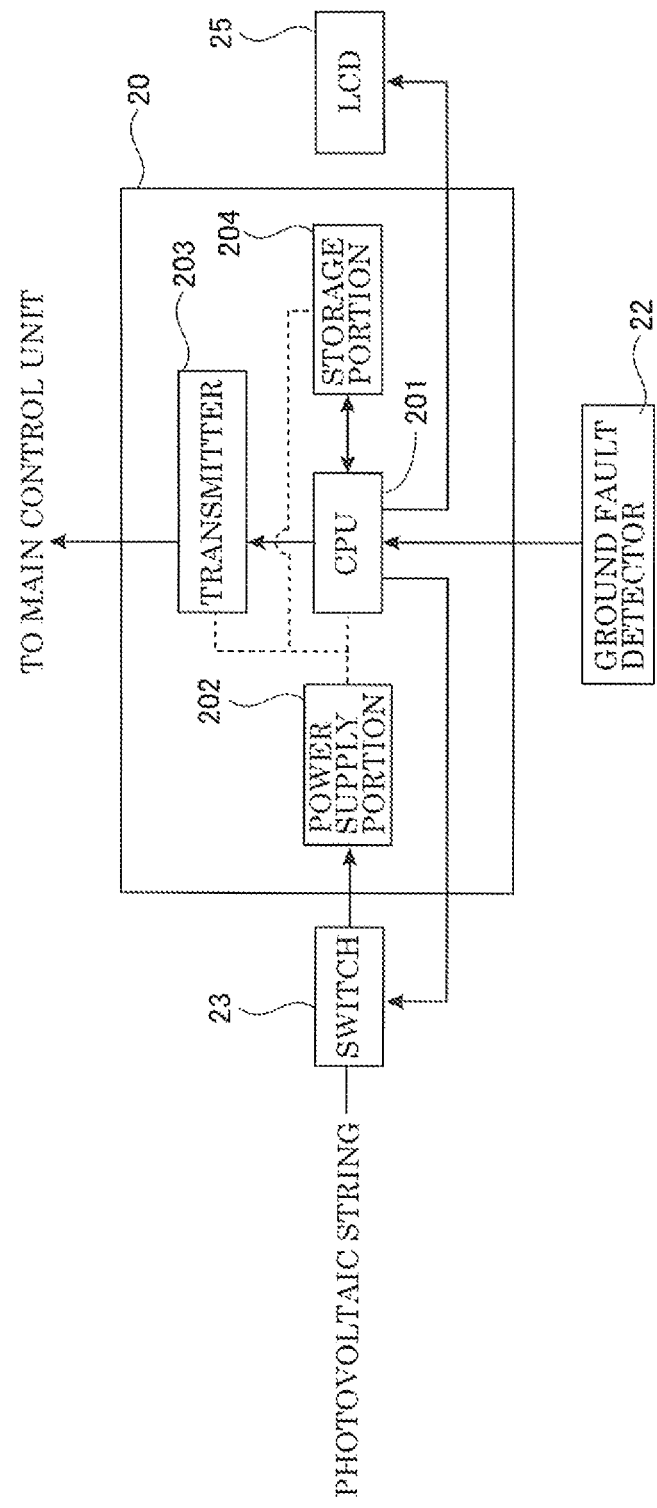
[FIG. 4] A functional block diagram of a control unit of the current collecting box of the photovoltaic power generating device according to the embodiment of the invention.

FIG. 4 is a functional block diagram showing a configuration of the control unit 20 in the current collecting box 2. The control unit 20 comprises a microcomputer which contains a CPU (Central Processing Unit) 201, a transmitter 203 and a storage portion 204 including a ROM (Read Only Memory) and a RAM (Random Access Memory). The ROM of the storage portion 204, for example, contains programs for controlling the operations of the current collecting box 2 which include the ground fault detection, the on/off control of the switch 23 and the like. In the event of a ground fault, the CPU 201 executes programs for detecting a ground fault, identifying the photovoltaic string 10 corresponding to the ground fault, switching off the switch 23, transmitting the failure signal and the like, and controls the individual operations. The transmitter 203 transmits various information items to the main control unit 6 via the communication path 8.

The current collecting box 2 is provided with a power supply portion 202. When the electric power is supplied from the photovoltaic strings 10 via the switches 23, a part of the electric power is supplied to the power supply portion 202. The power supply portion 202 is supplied with electric power from the system 5 when the photovoltaic strings 10 do not supply the electric power. The power supply portion 202 supplies the electric power to the CPU 201, transmitter 203, storage portion 204 and the like. This power supply portion 202 is equipped with a secondary battery which is charged with the supplied electric power. The power supply portion is adapted to ensure the operation of the control unit 20 even when the photovoltaic strings 10 do not generate the electric power.

When detecting a ground fault or the like, the control unit 20 transmits from the transmitter 203 to the communication path 8, an ID number assigned for the identification of current collecting box 2 and the information concerning the photovoltaic string 10 suffering the ground fault, the communication path 8 in turn sends the ID number and the information to the main control unit 6. The display unit 25 displays information for the identification of the photovoltaic string 10 suffering the ground fault and information indicating the time of ground fault occurrence and the like.

As shown in FIG. 1 and FIG. 2, the power conditioner 4 is supplied with the electric power from the plural current collecting boxes $2_1$ to $2_n$ via the connecting cables 3. The power conditioner 4 supplies the electric power from the connecting cables 3 to the inverter 41 via a switch 43 and a ground fault detector 42. The inverter 41 converts the supplied direct current power into the alternating current power. The inverter 41 outputs the alternating current power to the system 5 via a switch 44. The on/off state of the switches 43, 44 is controlled by the control unit 40. As described above, the plural photovoltaic strings 10 are connected to the current collecting box 2, and the plural current collecting boxes 2 are connected to the power conditioner 4. The numerical relations of these components is expressed as photovoltaic strings 10>current collecting boxes 2>power conditioner 4. That is, the number of the photovoltaic strings 10 is the largest and the number decreases in the descending order of the current collecting box 2 and the power conditioner 4. Incidentally, the switch 42 may be disposed externally of the power conditioner 4.

The ground fault detector 42 for ground fault detection is interposed between the switch 43 and the inverter 41. The ground fault detector 42 detects the differential current between the forward current cable and the backward current cable based on the magnetic fields generated in these cables. If the detection result is equal to or more than the constant value, a signal indicating the occurrence of ground fault is output to the control unit 40. Since outputs from the plural current collecting boxes 2 are collectively supplied to the power conditioner 4, the individual connecting cables 3 from the current collecting boxes have different lengths according to distances therefrom. Therefore, the detection sensitivity of the ground fault detector 42 needs to be defined in consideration of the noises. The ground fault detector 22 used in the current collecting box 2 and the ground fault detector 42 used in the power conditioner 4 have different noises superimposed on the lines connected thereto because the lines led thereto have different lengths and locations. Because of the different noises, the detection sensitivity, which is defined in consideration of the noises, differs between the ground fault detectors 22, 42.

The line from the current collecting box 2 to the power conditioner 4 is normally longer than the line from the photovoltaic string 10 to the current collecting box 2. Further, the noises superimposed on the connecting cable 3 connected to the power conditioner 4 is of the greater magnitude. According to the embodiment, therefore, the ground fault detector 42 has the lower ground fault detection sensitivity than the ground fault detector 22 of the current collecting box 2 because the ground fault detection with high sensitivity may lead to a noise-induced false detection of ground fault.

Based on the output from the ground fault detector 42, the control unit 40 can determine whether or not a ground fault is present between the current collecting box 2 and the power conditioner 4. Instead of utilizing the magnetic field, the ground fault detector 42 may employ a clamp-on current sensor for detecting the differential current.

Obtaining the detection signal indicating the occurrence of a ground fault from the ground fault detector 42, the control unit 40 switches off the switch 43 connecting the inverter 41 with the connecting cable 3, and the switch 44 connecting the inverter 41 with the system 5, namely cuts off the power supply to the switches 43, 44 so as to break the circuit. When supplied with the electric power, the switches 43, 44 are switched on so as to maintain the electrical connection. When the power supply to the switches 43, 44 is cut off, the switches 43, 44 are switched off acting to break the electrical connection.

Upon detection of the ground fault, the control unit 40 stops controlling the inverter 41 and deactivates the same. Subsequently, the control unit switches off the switch 44 to break the electrical connection between the power conditioner 4 and the system 5. Then, the control unit switches off the switch 43 to break the electrical connection between the inverter 41 and the connecting cable 3. The control unit 40 stores information concerning the occurrence of the ground fault in the internal storage device thereof and also sends such information to the main control unit 6 via the communication path 8.

The control unit 40 applies PWM control to switching elements constituting the inverter 41 such that the system 5 is supplied with an alternating current power having a predetermined voltage and a predetermined frequency. The inverter 41 is activated by inputting a PWM signal from the control unit 40 and deactivated by cutting off the supply of the PWM signal. The inverter is activated when a voltage inputted from the connecting cable 3 is greater than a reference voltage. Hence, the control unit 40 is supplied with the voltage from the connecting cable so as to compare the input voltage to the inverter 41 with the reference voltage. If the input voltage is greater than the reference voltage, the control unit applies the PWM signal to the inverter 41 to activate the same. When the input voltage or power falls below a predetermined value, the control unit 40 cuts off the supply of PWM signal to deactivate the inverter 41. The predetermined value means a preset value of voltage required for operating the inverter 41. The control unit 40 is adapted to achieve power saving by switching off the switches 43, 44 during the nighttime period or the like when the photovoltaic strings 10 do not generate the electric power. A power supply to the ground fault detector 42 is also stopped.

Assuming that V1 represents a startup voltage of the inverter 41, V2 represents a shutdown voltage thereof and $V_{pn}$ represents a photovoltaic voltage supplied to the inverter 41 via the connecting cable 3, the control unit 40 provides the on/off control of the switches 43, 44 by checking the voltage $V_{pn}$. Specifically, the control unit holds the switches 43 and 44 in the on state during the operation of the inverter 41. The switch 43 is switched on prior to the activation of the inverter 41. After activation, the switch 44 is switched on.

The on-condition for the switches 43, 44 is defined as $V_{pn}>=$(is equal to or more than) V1−50V, where "50V" is merely exemplary and varies depending upon the system.

The off-condition for the switches 43, 44 is defined as continuation of the state $V_{pn}<=$(is equal to or less than) V2−50V for 30 minutes. This is because the photovoltaic voltage is not necessarily decreased to 0V depending upon the installation environment of the photovoltaic cells. The above values 30 minutes and 50V are merely exemplary and vary depending upon the system.

Besides the activation process and the ground fault process, the control unit 40 also checks the voltage $V_{pn}$ of the photovoltaic string 10 supplied via the connecting cable 3 and provides the on/off control of the switches 43, 44 when the voltage $V_{pn}$ satisfies the above condition.

The control unit 40 is provided with a power supply portion (not shown in the figure). When the electric power is supplied from the photovoltaic strings 10, a part of the supplied electric power is supplied to the power supply portion. The power supply portion is supplied with electric power from the system 5 when the photovoltaic strings 10 do not supply the electric power. The power supply portion may be provided with a secondary battery which is charged with the electric power from either the photovoltaic strings 10 or the system 5. The power supply portion may be adapted to apply the charged power to the operation of the control unit 40 and the like.

The control unit 40 performs the activation process for activating the inverter 41. The activation process is started at sunrise, for example, when the photovoltaic strings 10 start receiving the sunlight. The activation process is also performed in a case where the inverter 41 is inactive during a period when the photovoltaic strings 10 can be subjected to the sunlight, namely a case where, for example, the sunlight is temporarily blocked to disable the photovoltaic strings 10 to output the electric power. The activation process is performed as follows. When the photovoltaic voltage $V_{pn}$ supplied to the control unit 40 satisfies the above condition, the control unit first switches off the switch 43. When the photovoltaic voltage $V_{pn}$ reaches V1, the control unit activates the inverter 41 and switches on the switch 44 to make the electrical connection with the system 5.

The control unit 40 also performs a deactivation process for deactivating the inverter 41. The deactivation process except for deactivation caused by a ground fault is started at sunset, for example, when the photovoltaic strings 10 are not irradiated with the sunlight any more. The deactivation process is also performed in a case where the output from the photovoltaic strings 10 is lowered during the period when the photovoltaic strings 10 can be subjected to the sunlight. When the photovoltaic voltage $V_{pn}$ reaches V2, the inverter 41 becomes inactive. Then, the switch 44 is switched off. At this time, the switch 43 is in the on state. This is because the control unit does not immediately respond to a temporary voltage fluctuation to cut off the power supply to the inverter 41. When the photovoltaic voltage $V_{pn}$ satisfies the above condition, the control unit switches off the switch 43.

Upon detection of the ground fault, the control unit 40 immediately performs the deactivation process. The control unit stops controlling the inverter 41 and deactivates the same. Subsequently, the control unit switches off the switch 44 to break the electrical connection between the power conditioner 4 and the system 5 for ensuring safety. Then, the control unit switches off the switch 43 to break the electrical connection between the inverter 41 and the connecting cable 3. The control unit 40 stores information concerning the occurrence of the ground fault in the internal storage device thereof and also sends such information to the main control unit 6 via the communication path 8.

Figure 5:
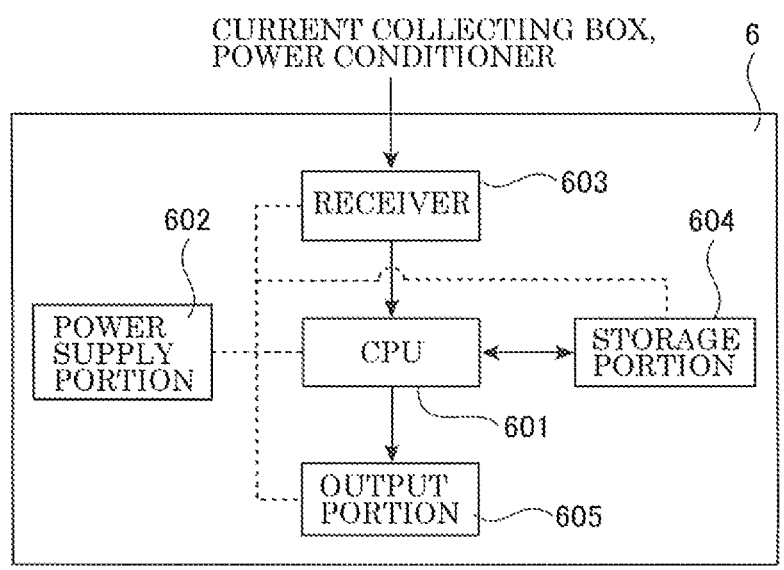
[FIG. 5] A functional block diagram showing a configuration of a main control unit having a function to record ground fault information.

FIG. 5 is a functional block diagram showing a configuration of the main control unit 6 having a function to record information on ground fault occurrence. The main control unit 6 is communicably connected to the plural current collecting boxes 2 and one or more power conditioners 4 via the communication path 8. As shown in the figure, the main control unit 6 includes a CPU 601, a power supply portion 602, a receiver 603, a storage portion 604 and an output portion 605.

The receiver 603 receives notification data from the individual current collecting boxes 2 and the power conditioner(s) 4 via the communication path 8 and supplies the received data to the CPU 601. The storage portion 604 contains programs for executing the operations of the main control unit and also stores the ID numbers, measurement date and results of the current collecting boxes 2 and the power conditioner(s) 4, which are contained in the notification data.

The CPU 601 stores the received data in the storage portion 604 and supplies failure-related information such as ground fault to the output portion 605.

The output portion 605 outputs the ground fault information to the liquid crystal display (LCD) and a speaker. A maintenance worker can find out which of the current collecting boxes 2 or the power conditioners 4 suffers the ground fault by referring to the information displayed on an output portion 605 of the main control unit 6. The power supply portion 602 supplies the electric power to the CPU 601, receiver 603, storage portion 604, output portion 605 and the like. This power supply portion 602 may be equipped with a secondary battery.

An area requiring the maintenance work can be identified by referring to the above-described information displayed on the output portion 605. The maintenance worker can perform the job at the current collecting box 2 or power conditioner 4 which suffers the ground fault. The display unit 25 of the current collecting box 2 displays information on the photovoltaic string 10 suffering the ground fault and the on/off state of the switch 23 connected to this photovoltaic string 10. The worker can go on with his job according to the displayed information thereby safely and quickly accomplishing the replacement of the photovoltaic string 10.

Figure 6:
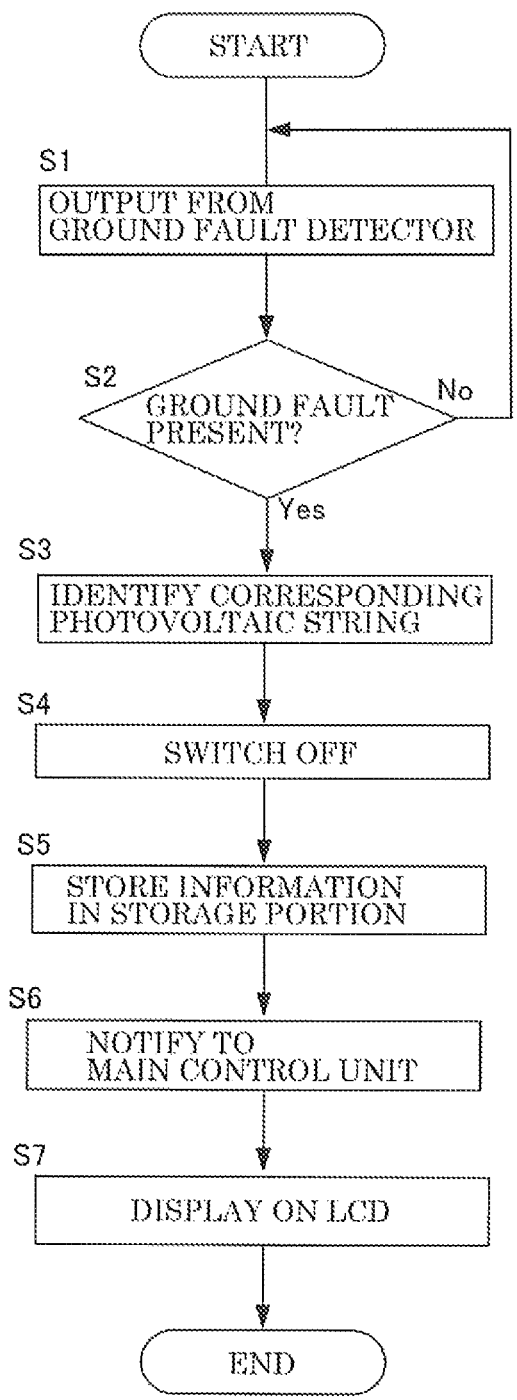
[FIG. 6] A flow chart showing the steps of a ground fault detection process performed by the control unit of the current collecting box in the photovoltaic power generating device according to the embodiment of the invention.

Next, a ground-fault detection process by the control unit 20 of the current collecting box 2 according to the invention is described with reference to a flow chart shown in FIG. 6.

An output from the ground fault detector 22 disposed between each switch 23 and each photovoltaic string 10 is supplied to the control unit 20 (Step S1).

The control unit 20 determines whether the ground fault is present or not based on the output from the ground fault detector 22 (Step S2). If the ground fault is absent, the operation flow returns to Step S1 to check an output from the ground fault detector 22.

Obtaining a detection signal indicating the occurrence of the ground fault, the control unit 20 identifies the photovoltaic string 10 suffering the ground fault (Step S3). The control unit switches off the switch 23 connected to the photovoltaic string 10 suffering the ground fault, namely applies control to break the circuit (Step S4).

Subsequently, the control unit 20 stores, in the internal storage portion 204 thereof, the information concerning the occurrence of the ground fault and the photovoltaic string 10 suffering the ground fault (Step S5). Subsequently, the control unit sends out the information from the transmitter 203 to the main control unit 6 via the communication path 8, the information concerning the current collecting box 2, the ground fault occurrence and the photovoltaic string 10 suffering the ground fault (Step S6). The control unit displays such information on the display unit 25 (Step S7) before completing the ground fault detection processes.

Figure 7:
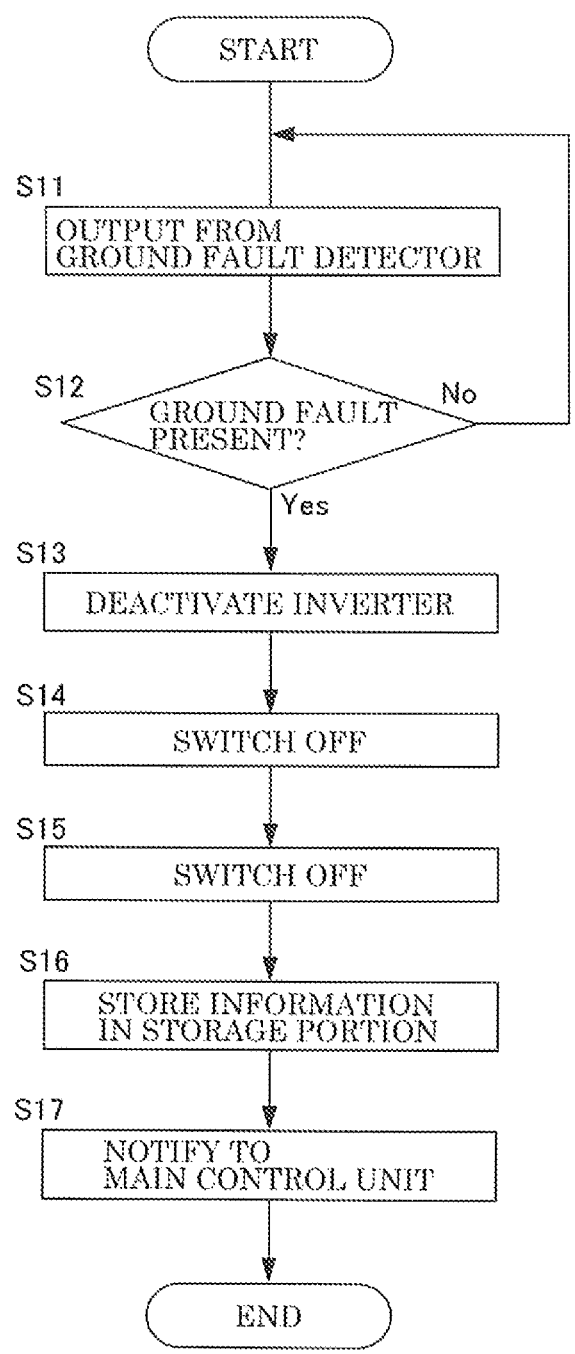
[FIG. 7] A flow chart showing the steps of a ground fault detection process performed by a control unit of a power conditioner in the photovoltaic power generating device according to the embodiment of the invention.

Next, a ground fault detection process by the control unit 40 of the power conditioner 4 according to the invention is described with reference to a flow chart of FIG. 7.

An output from the ground fault detector 42 disposed between a connecting cable 3 and inverter 41 is supplied to the control unit 40. (Step S11).

The control unit 40 determines whether the ground fault is present or not based on the output from the ground fault detector 42 (Step S12). If the ground fault is absent, the operation flow returns to Step S11 to check the output from the ground fault detector 42.

Obtaining a detection signal indicating the occurrence of the ground fault, the control unit 40 stops controlling the inverter 41 and deactivates the inverter 41 (Step S13). Subsequently, the control unit switches off the switch 44 so as to break the electrical connection between the power conditioner 4 and the system 5 (Step S14). Then, the control unit switches off the switch 43 thus breaking the electrical connection between the inverter 41 and the connecting cable 3 (Step S15).

Subsequently, the control unit 40 stores information concerning the occurrence of the ground fault in the internal storage device thereof (Step S16). The control unit sends out the information on the occurrence of ground fault through the communication path 8 (Step S17). The information is transmitted to the main control unit 6 via the communication path 8.

It should be understood that the embodiments disclosed herein are to be taken as examples in every point and are not limited. The scope of the present invention is defined not by the above described embodiments but by the appended claims. All changes that fall within means and bounds of the claims or equivalence of such means and bounds are intended to be embraced by the claims.

What is claimed is:

1. A photovoltaic power generating device, comprising:
   a plurality of photovoltaic strings;
   a current collecting box serving to collect electric power from the plural photovoltaic strings; and
   a power conditioner supplied with the electric power from the plural current collecting boxes, and having an inverter for converting the electric power into the alternating current power,
   wherein the current collecting box includes:
   a current collecting box side detector for detecting a ground fault in each of the photovoltaic strings;
   a current collecting box side switch provided in correspondence to each of the photovoltaic strings and interposed between the photovoltaic string and a connecting cable; and
   a current collecting box side control unit applying an on/off control to the switch according to a detection result supplied from the detector, and
   wherein the power conditioner includes:
   an inverter side detector for detecting a ground fault in a connecting cable between the current collecting box and the power conditioner;
   an inverter side switch interposed between the connecting cable and the inverter; and
   a power conditioner side control unit applying an on/off control to the inverter side switch according to a detection result supplied from the inverter side detector.

2. The photovoltaic power generating device according to claim 1, wherein a line from the current collecting box to the power conditioner is longer than the line from the photovoltaic string to the current collecting box.

3. The photovoltaic power generating device according to claim 1, wherein the current collecting box side detector has different detection sensitivity from the inverter side detector.

4. The photovoltaic power generating device according to claim 1, wherein the detection sensitivity of the current collecting box side detector is higher than that of the inverter side detector.

5. The photovoltaic power generating device according to claim 1, wherein the number of the photovoltaic strings is the largest and the number decreases in the descending order of the current collecting box and the power conditioner.

6. The photovoltaic power generating device according to claim 1, wherein a main control unit of the photovoltaic power generating device is connected with the current collecting box and the power conditioner via a communication path, and information concerning the occurrence of a ground fault is sent to the main control unit.

7. A controlling method for a photovoltaic power generating device that comprises: a plurality of photovoltaic strings; a current collecting box serving to collect electric power from the plural photovoltaic strings; and a power conditioner supplied with the electric power from the plural current collecting boxes, and having an inverter for converting the electric power into the alternating current power, wherein the current collecting box includes: a current collecting box side detector for detecting a ground fault in each of the photovoltaic strings; a switch provided in correspondence to each of the photovoltaic strings and interposed between the photovoltaic string and a connecting cable; and a current collecting box side control unit applying an on/off control to the switch according to a detection result supplied from the detector, and the power conditioner includes: an inverter side detector for detecting a ground fault in a connecting cable between the current collecting box and the power conditioner; an inverter side switch interposed between the connecting cable and the inverter; and a power conditioner side control unit applying an on/off control to the inverter side switch according to a detection result supplied from the inverter side detector, the method comprising:
   upon detection of a ground fault by the current collecting box side detector, switching off the switch of the corresponding photovoltaic string so as to cut off an output from the corresponding photovoltaic string, and
   upon detection of a ground fault by the inverter side detector, switching off the inverter side switch so as to break connection between the connecting cable and the inverter.

8. The controlling method for a photovoltaic power generating device according to claim 7, wherein the device further comprises a communication path for connecting a main control unit of the photovoltaic power generating device with the current collecting box and the power conditioner,
   the method further comprising upon detection of a ground fault by the current collecting box side detector or the inverter side detector, sending information concerning the occurrence of a ground fault to the main control unit.

* * * * *